United States Patent [19]

Bullington et al.

[11] Patent Number: 5,242,534

[45] Date of Patent: Sep. 7, 1993

[54] PLATINUM LIFT-OFF PROCESS

[75] Inventors: Jeff A. Bullington; Carl E. Montross, Jr., both of Albuquerque, N. Mex.

[73] Assignee: Radiant Technologies, Albuquerque, N. Mex.

[21] Appl. No.: 947,272

[22] Filed: Sep. 18, 1992

[51] Int. Cl.$^5$ .............................................. B44C 1/22
[52] U.S. Cl. .................... 156/634; 437/203; 437/189; 437/235
[58] Field of Search ............... 437/203, 201, 246, 919, 437/944, 179, 190, 192, 195; 156/634, 656, 664; 148/DIG. 105

[56] References Cited

U.S. PATENT DOCUMENTS

| | | | |
|---|---|---|---|
| 3,669,730 | 6/1972 | Lepselter | 437/201 |
| 3,993,515 | 11/1976 | Reichert | 437/246 |
| 4,078,963 | 3/1978 | Symersky | 156/656 |
| 4,087,315 | 5/1978 | Auracher et al. | 156/656 |
| 4,339,305 | 7/1982 | Jones | 437/203 |
| 4,391,849 | 7/1983 | Bischoff | 156/664 |
| 4,533,431 | 8/1985 | Dargent | 156/656 |
| 4,584,761 | 4/1986 | Wu | 148/DIG. 105 |
| 4,662,989 | 5/1987 | Casey et al. | 156/664 |
| 4,789,645 | 12/1988 | Calviello et al. | 148/DIG. 14 |
| 5,072,520 | 12/1991 | Nelson | 156/656 |

FOREIGN PATENT DOCUMENTS

| | | | |
|---|---|---|---|
| 62-145745 | 6/1987 | Japan | 437/195 |
| 1201938 | 8/1989 | Japan | 437/203 |

Primary Examiner—Brian E. Hearn
Assistant Examiner—Michael Trinh
Attorney, Agent, or Firm—McCubbrey, Bartels, Meyer & Ward

[57] ABSTRACT

A method for generating platinum features on the surface of a substrate is disclosed. The method provides an inexpensive means for constructing small platinum features. The method utilizes a photoresist mask to define the platinum features. The problems associated with residue from the deposition of the photoresist mask are overcome by utilizing an etching step which removes any such residue. The etching step also allows the platinum features to be recessed into the substrate surface.

4 Claims, 2 Drawing Sheets

PLATINUM LIFT-OFF PROCESS

FIELD OF THE INVENTION

The present invention relates to integrated circuit devices, and more particularly, to an improved method for constructing small electrodes made of platinum.

BACKGROUND OF THE INVENTION

Ferroelectric based capacitors are in increasing demand as integrated circuit elements. Capacitors having platinum lanthanum titanium zirconate (PLZT) dielectrics offer large dielectric constants which in turn make the construction of small capacitors with relatively large capacitances possible. A ferroelectric capacitor consists of a PLZT layer sandwiched between two planar electrodes. Capacitors utilizing platinum electrodes are particularly advantageous, since such capacitors exhibit reduced aging effects compared to capacitors utilizing other electrode materials.

The bottom electrode of a PLZT capacitor is typically deposited on the semiconductor surface or a $SiO_2$ layer thereon. To "stick" the platinum layer to the silicon, a titanium layer is deposited on the silicon surface prior to depositing the platinum layer. During the subsequent deposition of the PLZT material and the annealing thereof, the titanium tends to diffuse into the platinum. If the platinum layer is too thin, the titanium will reach the PLZT surface and form an oxide thereon which interferes with the operation of the capacitor; hence, relatively thick (>1000 Å) platinum layers must be employed.

It is difficult to pattern such thick electrode structures, particularly in those cases in which small platinum structures must be generated. In principle, the platinum can be patterned using photoresist methods, ion milling, or etching with hot aqua regia. If small features are to be generated, hot aqua regia etching is unsatisfactory because it results in undercutting of the platinum structure; hence, the minimum feature size is limited by thickness of the platinum layer. Ion milling produces satisfactory structures, but requires expensive equipment, and is difficult to control. Hence, the method of choice is a lift-off process using photoresist.

Unfortunately, prior art photoresist processes are found to be unsatisfactory when applied to platinum electrodes for PLZT structures such as capacitors. The photoresist process leaves material on the surface of the silicon substrate which reduces the strength of the bond between the $SiO_2$ and the titanium-platinum layer. In subsequent PLZT deposition and annealing steps, the bond is stressed by the expansion and contraction of the PLZT layer which is in contact with the platinum. The stress is sufficient to cause the platinum layer to separate from the $SiO_2$ substrate.

Broadly, it is the object of the present invention to provide an improved lift-off process for patterning platinum structures on integrated circuits.

It is a further object of the present invention to provide a lift-off process which produces platinum structures that can withstand the physical stress of PLZT deposition and annealing without detaching from the underlying substrate.

These and other objects of the present invention will become apparent to those skilled in the art from the following detailed description of the invention and the accompanying drawings.

SUMMARY OF THE INVENTION

The problems associated with residue from the deposition of the photoresist mask discussed above are overcome in the present invention by utilizing an etching step which removes any such residue. The etching step also allows the platinum features to be recessed into the substrate surface. In the method of the present invention, a layer of titanium is deposited on the substrate and then the titanium layer is masked in regions outside the region to be covered by the electrode by applying a layer of masking material. The exposed regions of the titanium layer are then etched. A new layer of titanium is then deposited followed by a layer of platinum. The masking material is then removed leaving the platinum electrode bonded to the substrate by the newly deposited titanium layer.

DETAILED DESCRIPTION OF THE INVENTION

Figure 2:
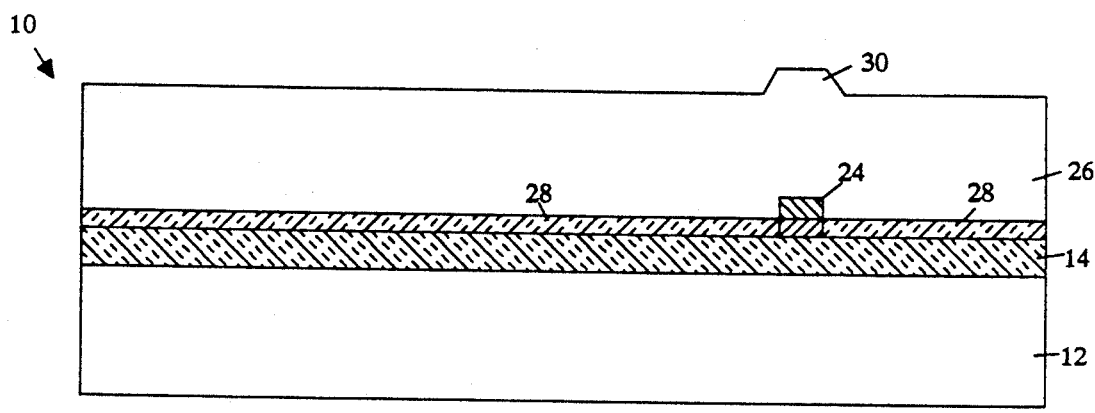
FIGS. 1 and 2 are a cross-sectional view of an integrated circuit substrate at different stages in the deposition of a platinum electrode according to the prior art.
Figure 1:
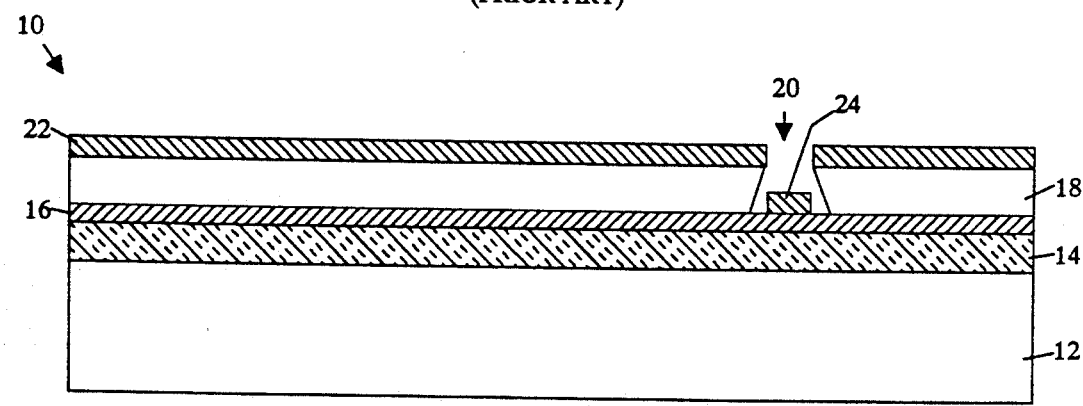

The manner in which the present invention obtains its advantages over the prior art may be more easily understood with reference to FIGS. 1 and 2 which illustrate a prior art method for fabricating a platinum electrode under a PLZT layer using a photoresist mask. Referring to FIG. 1, an $SiO_2$ layer 14 is first deposited on a silicon substrate 12. A titanium layer 16 is then deposited on top of $SiO_2$ layer 14. Next, a patterned photoresist layer 18 is deposited leaving an opening 20 which defines the platinum layer. A platinum layer 22 is then deposited on top of photoresist layer 18. The platinum deposited over opening 20 creates electrode 24. The photoresist is then removed and a PLZT layer 26 is deposited on titanium layer 16 and electrode 24. During the PLZT annealing process, the portions 28 of titanium layer 16 that are exposed to the PLZT material are oxidized to form a $TiO_2$ insulating layer. The portion of titanium layer 16 below the electrode remains in the metallic state.

This prior art method has two problems. First, the deposition of the photoresist layer leaves a residue in opening 20 which interferes with the binding of electrode 24 to titanium layer 16. When PLZT layer 26 is deposited and annealed, the layer expands and contracts which stresses the bond between electrode 24 and titanium layer 16. This often results in the separation of electrode 24 from titanium layer 16. Second, the height of electrode 24 causes layer 26 to bulge as shown at 30. Such irregularities complicate the deposition of subsequent layers.

Figure 5:
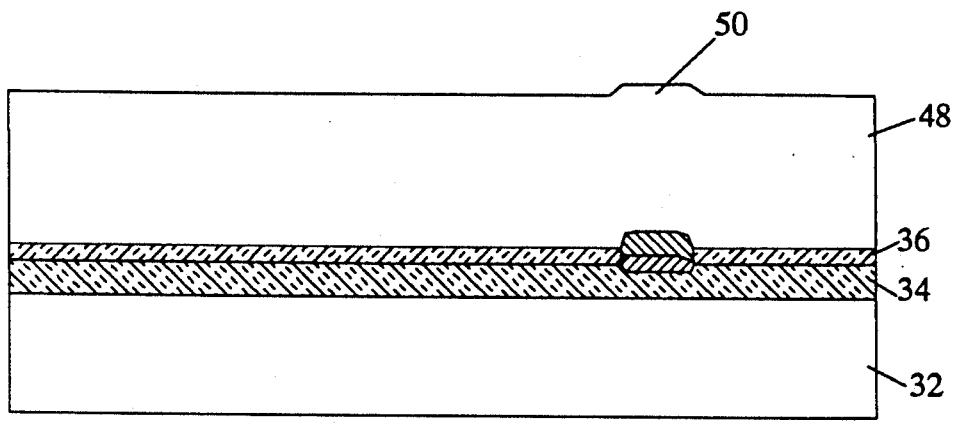
FIGS. 3–5 are a cross-sectional view of an integrated circuit substrate at different stages in the deposition of a platinum electrode according to the method of the present invention.
Figure 3:
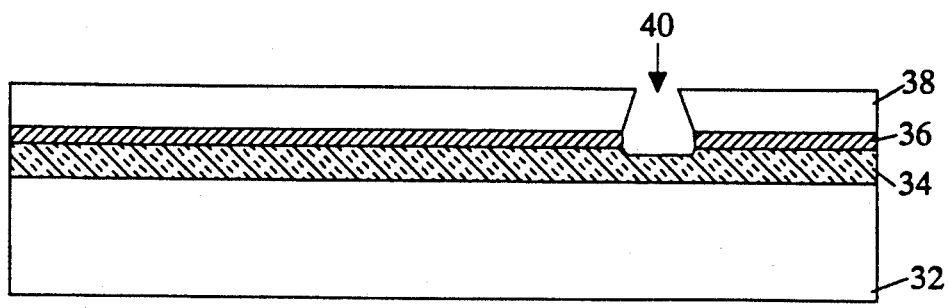

The present invention provides better bonding between the titanium glue layer and the platinum electrode. In addition, the present invention reduces the size of irregularities such as that shown at 30 in FIG. 2. The manner in which the present invention achieves these advantages may be more easily understood with reference to FIGS. 3–5 which illustrate the deposition of a platinum electrode according to the method of the present invention. The deposition process is begun by depositing an $SiO_2$ layer 34 on a silicon substrate 32. A titanium layer 36 that is approximately 1000 Å thick is then deposited on SiO₂ layer 34 and a patterned layer 38 of photoresist is deposited on titanium layer 36. The titanium layer is then etched using a solution of water, HCl, and buffered oxide etchant in the ratios of 3:1:1. The buffered oxide etchant is a dilute HF solution which is commercially available and common in the art. The etching is sufficient to remove the titanium layer in areas that are not protected by the photoresist layer. An exemplary such location is shown at 40. The etching is preferably continued into the SiO₂ layer 34.

The etching operation provides two benefits. First, it removes any residue generated by the deposition of the photoresist. Second, the subsequently deposited electrode layers are counter sunk in SiO₂ layer 34 thereby reducing the bulging problem discussed above.

Figure 4:
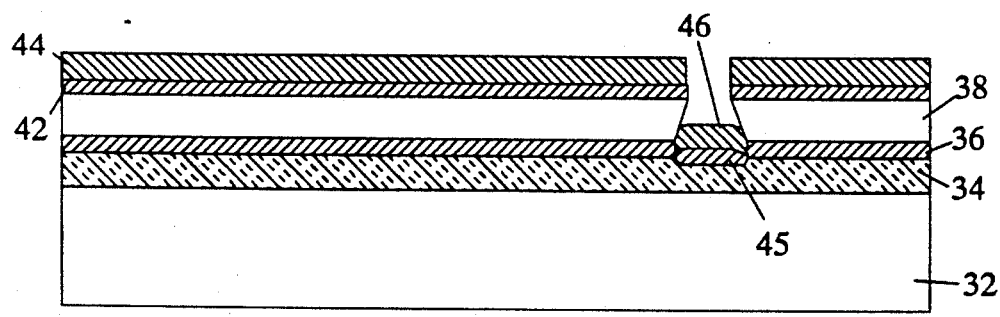

Referring to FIG. 4, after the etching operation is completed, an approximately 1000 Å layer 42 of titanium is deposited. This generates a titanium base layer 45 which will "glue" the subsequently deposited platinum to the SiO₂ layer. As noted above, the etching operation has removed any residue resulting from the photoresist deposition; hence, the titanium is firmly bound to the SiO₂ surface. Next, an approximately 2000 Å layer 44 of platinum is deposited. This generates the platinum electrode 46 in those regions that are not protected by the photoresist. The photoresist is then removed leaving electrode 46 slightly raised with respect to titanium layer 36. Finally, a PLZT layer 48 may be deposited over the surface. Since electrode 46 is recessed relative to prior art electrodes, the irregularities 50 in PLZT layer 48 are less severe than with those obtained using prior art methods.

The above-described embodiments of the present invention have been described in terms of a "glue" layer comprising titanium. However, it will be apparent to those skilled in the art that other glue layer materials may be used. For example, gold is also found to act as a glue material. Any material that will bond the platinum to the substrate with sufficient force to resist separation of the platinum from the substrate during subsequent processing steps may be used, provided the material may be etched.

While the present invention has been described in terms of the manufacture of PLZT based capacitors, it will be apparent to those skilled in the art that the method may be utilized in other contexts in which small platinum features are to be generated. Similarly, the present invention has been described with reference to specific thicknesses of electrodes and specific etchants; however, it will be apparent to those skilled in the art that the present invention will operate satisfactorily with other values for these parameters. Accordingly, the present invention is to be limited solely by the scope of the following claims.

What is claimed is:

1. A method for depositing a platinum electrode in a predetermined region on the surface of a substrate, said method comprising the steps of:

depositing a first layer of a glue material on said substrate, said glue material being a material capable of bonding platinum to said substrate;

masking said first layer in regions outside of said predetermined region by applying a layer of masking material on said regions;

etching said first layer in said predetermined region;

depositing a layer of said glue material in said predetermined region;

depositing a platinum layer in said predetermined region; and removing said masking material.

2. The method of claim 1 wherein said step of etching said first layer further comprises etching a portion of the surface of said substrate.

3. The method of claim 1 wherein said glue material is platinum.

4. The method of claim 1 wherein said glue material is gold.

* * * * *